(12) United States Patent
Okugawa et al.

(10) Patent No.: US 8,592,256 B2
(45) Date of Patent: Nov. 26, 2013

(54) CIRCUIT BOARD MANUFACTURING METHOD, SEMICONDUCTOR MANUFACTURING APPARATUS, CIRCUIT BOARD AND SEMICONDUCTOR DEVICE

(75) Inventors: Yoshitaka Okugawa, Tokyo (JP); Keiichi Tsukurimichi, Tokyo (JP); Hitoshi Kawaguchi, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 556 days.

(21) Appl. No.: 12/526,631

(22) PCT Filed: Feb. 8, 2008

(86) PCT No.: PCT/JP2008/052586
§ 371 (c)(1),
(2), (4) Date: Aug. 11, 2009

(87) PCT Pub. No.: WO2008/099940
PCT Pub. Date: Aug. 21, 2008

(65) Prior Publication Data
US 2010/0038762 A1    Feb. 18, 2010

(30) Foreign Application Priority Data

Feb. 16, 2007 (JP) ................................. 2007-036257
Mar. 30, 2007 (JP) ................................. 2007-092209

(51) Int. Cl.
*H01L 23/28* (2006.01)
(52) U.S. Cl.
USPC .... 438/108; 438/124; 257/678; 257/E21.502; 257/E23.116

(58) Field of Classification Search
USPC ........... 257/678, E21.502, E23.116; 438/124; 219/385
See application file for complete search history.

(56) References Cited

U.S. PATENT DOCUMENTS

| | | | | |
|---|---|---|---|---|
| 4,794,217 A * | 12/1988 | Quan et al. | ...................... | 438/14 |
| 4,983,804 A * | 1/1991 | Chan et al. | ..................... | 219/616 |
| 5,516,030 A * | 5/1996 | Denton | ................... | 228/180.22 |
| 5,919,329 A * | 7/1999 | Banks et al. | .................. | 156/281 |
| 5,926,696 A * | 7/1999 | Baxter et al. | .................. | 438/118 |
| 6,077,382 A * | 6/2000 | Watanabe | ..................... | 156/322 |
| 6,432,748 B1 * | 8/2002 | Hsu | ................ | 438/121 |
| 6,518,666 B1 * | 2/2003 | Ikeda | ............................ | 257/738 |
| 6,566,165 B1 * | 5/2003 | Otani et al. | .................. | 438/108 |
| 6,593,255 B1 * | 7/2003 | Lawton et al. | .................. | 442/59 |
| 6,897,410 B1 * | 5/2005 | Ho et al. | ....................... | 219/385 |
| 6,906,425 B2 * | 6/2005 | Stewart et al. | ................ | 257/778 |

(Continued)

FOREIGN PATENT DOCUMENTS

| | | |
|---|---|---|
| JP | 2000-091476 | 3/2000 |
| JP | 2000-216299 | 8/2000 |

(Continued)

*Primary Examiner* — Cheung Lee
*Assistant Examiner* — William Harriston
(74) *Attorney, Agent, or Firm* — Ditthavong Mori & Steiner, P.C.

(57) ABSTRACT

There is provided a circuit board manufacturing method that makes it possible to manufacture a next-generation semiconductor device in a stable manner and improve the yield during secondary mounting processing. A circuit board 11 with a thickness of 230 μm manufactured using a cyanate-based prepreg 12 containing a resin composition with which a glass cloth is impregnated is heated at a higher temperature than a glass transition temperature of the resin composition after it is cured before reflow processing.

5 Claims, 10 Drawing Sheets

(56) References Cited

U.S. PATENT DOCUMENTS

| | | | |
|---|---|---|---|
| 7,084,511 B2* | 8/2006 | Matsuda | 257/775 |
| 7,928,016 B2* | 4/2011 | Kawano | 438/761 |
| 8,073,316 B2* | 12/2011 | Nakagawa | 392/416 |
| 2001/0020736 A1* | 9/2001 | Nakazawa et al. | 257/678 |
| 2002/0039644 A1* | 4/2002 | Kimbara et al. | 428/209 |
| 2002/0135061 A1* | 9/2002 | Okamoto et al. | 257/703 |
| 2002/0187353 A1* | 12/2002 | Nakamura et al. | 428/416 |
| 2003/0111154 A1* | 6/2003 | Fogal et al. | 156/64 |
| 2004/0171769 A1* | 9/2004 | Brennan et al. | 525/525 |
| 2004/0228778 A1* | 11/2004 | Murari et al. | 422/180 |
| 2004/0234741 A1* | 11/2004 | Hosomi et al. | 428/292.1 |
| 2005/0109757 A1* | 5/2005 | Ho et al. | 219/385 |
| 2005/0236104 A1* | 10/2005 | Tanaka | 156/308.2 |
| 2006/0214277 A1* | 9/2006 | Saeki | 257/684 |
| 2006/0226525 A1* | 10/2006 | Osuga et al. | 257/685 |
| 2007/0013049 A1* | 1/2007 | Asai et al. | 257/700 |
| 2007/0039999 A1* | 2/2007 | Sung | 228/43 |
| 2007/0045791 A1* | 3/2007 | Saeki | 257/668 |
| 2007/0152350 A1* | 7/2007 | Kim et al. | 257/786 |
| 2007/0167021 A1* | 7/2007 | Matsumoto | 438/711 |
| 2007/0275178 A1* | 11/2007 | Nishi et al. | 427/430.1 |
| 2007/0287021 A1* | 12/2007 | Takeuchi et al. | 428/623 |
| 2007/0292668 A1* | 12/2007 | Amou et al. | 428/209 |
| 2008/0023815 A1* | 1/2008 | Asai et al. | 257/687 |
| 2008/0296740 A1* | 12/2008 | Kawano | 257/635 |
| 2009/0133915 A1* | 5/2009 | Higashitani | 174/261 |
| 2009/0301760 A1* | 12/2009 | Shimamura et al. | 174/250 |
| 2010/0038762 A1* | 2/2010 | Okugawa et al. | 257/678 |
| 2010/0105173 A1* | 4/2010 | Fujimori | 438/121 |
| 2012/0043305 A1* | 2/2012 | Kelly et al. | 219/121.64 |

FOREIGN PATENT DOCUMENTS

| | | |
|---|---|---|
| JP | 2003-031926 | 1/2003 |
| JP | 2003-283109 | 10/2003 |
| TW | 200638812 | 11/2006 |
| WO | WO 2006/054637 | 5/2006 |

* cited by examiner

FIG.1
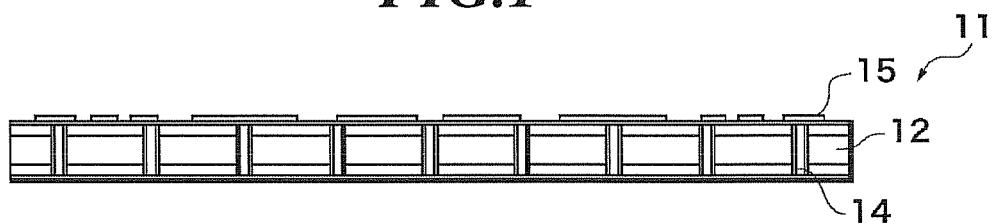
FIG.2A
FIG.2B
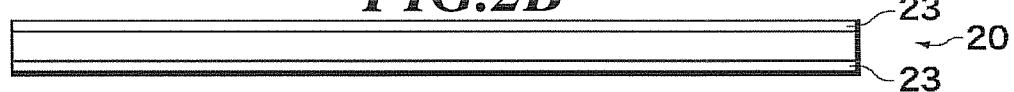
FIG.2C
FIG.2D
FIG.2E

UV IRRADIATION

HEAT

CIRCUIT BOARD MANUFACTURING METHOD, SEMICONDUCTOR MANUFACTURING APPARATUS, CIRCUIT BOARD AND SEMICONDUCTOR DEVICE

TECHNICAL FIELD

The present invention relates to a method of manufacturing a circuit board and a semiconductor manufacturing apparatus, and in particular to a method of manufacturing a next-generation circuit board and a semiconductor manufacturing apparatus.

BACKGROUND ART

In recent years, a heat-resistant material that does not contain halogen, phosphorous, and so on from the standpoint of protecting environment but is frame-resistant and to which Pb-free solder can be attached has been desired to be used as a board material. On the other hand, in market trends of downsizing, weight reduction, and function advancement of electronic devices, higher integration and surface mounting of semiconductor devices have advanced year by year. For example, an area-mounting semiconductor device such as a ball-grid array has been newly developed as a next-generation semiconductor device so as to fill the need for higher pin count and higher speed that have approached limits in surface-mounted semiconductor devices typified by QFP and SOP.

The area-mounting semiconductor device is assembled in the following process. First, a semiconductor element is mounted on one side of a circuit board, and only the semiconductor element mounting surface, that is, one side of the board is molded and encapsulated by an epoxy resin composition or the like. After that, processing (reflow processing) is carried out in which Pb-free solder balls are attached at a temperature of 230° C. to 260° C. to a surface of the circuit board on which the semiconductor element is not mounted. Further, processing in which the area-mounting semiconductor device is mounted on a substrate (secondary mounting processing) is carried out to manufacture an electronic device.

Thus, the material of the circuit board is required to have the property of high elastic modulus in heating so as to improve the ease of mounting during the reflow processing. Moreover, if a large amount of distortion occurs due to thermal expansion, stress on the board increases, and thus the circuit board is required to have the property of low coefficient of thermal expansion. On the other hand, at room temperature, even a thin board is required to have high stiffness. That is, the material of the circuit board (hereinafter referred to as "board material") is required to have the property of being highly heat-resistant, that is, the property of having a high glass transition temperature (Tg). For this reason, board materials having such properties are being developed.

On the other hand, if the circuit board is a thin type board with a thickness of not more than 500 μm, when the semiconductor element mounting surface is to be molded and encapsulated by an epoxy resin composition or the like, a large warp occurs due to cure shrinkage contraction of the epoxy resin composition or the like. The prior art that the semiconductor element mounting surface is encapsulated by a resin encapsulating layer with a low coefficient of thermal expansion so as to reduce the amount of warp is known (see, for example, Japanese Laid-open Patent Publication (Kokai) No. 2000-216299).

However, according to the prior art, although the amount of warp in the circuit board before the reflow processing can be reduced, the amount of warp occurring after the reflow processing cannot be reduced. For this reason, there is the problem that a semiconductor device cannot be manufactured in a stable manner.

For example, if a semiconductor device is manufactured using the above described board material having high elastic modulus in heating and high Tg as described above, a convex warp rounded downward with both ends regarded as reference positions, that is, a so-called smile warp occurs in the semiconductor device as shown in FIG. 12A before the reflow processing, and the warp inverts to become a convex warp rounded upward with both ends regarded as reference positions, that is, a so-called cry warp as shown in FIG. 12B after the reflow processing. In general, it is difficult to secondarily mount the semiconductor device in which such a cry warp has occurred on a substrate, and thus the problem that the yield during the secondary mounting processing deteriorates arises.

An object of the present invention is to provide a circuit board manufacturing method and a semiconductor manufacturing apparatus that make it possible to manufacture a next-generation semiconductor device in a stable manner and improve the yield during secondary mounting processing.

DISCLOSURE OF INVENTION

To attain the above object, in a first aspect of the present invention, there is provided a circuit board manufacturing method applied to a semiconductor device that is manufactured by impregnating a fiber base material with a resin to manufacture a circuit board with a thickness of not more than 500 μm, mounting a semiconductor element on the circuit board, encapsulating at least an upper portion and side faces of the mounted semiconductor element using a encapsulation resin composition, and attaching solder balls to a surface of the circuit board opposite to a surface thereof with the semiconductor device mounted thereon using a reflow device, comprising a heating step of heating the circuit board at a higher temperature than a glass transition temperature of the resin with which the fiber base material is impregnated after being cured before the attachment of the solder balls.

In the first aspect of the present invention, it is preferred that the maximum temperature of the circuit board when heated in the heating step is within a range of not less than a melting temperature of solder used in the attachment of the solder balls and not more than 80° C. plus the melting point.

In the first aspect of the present invention, it is preferred that the heating step is carried out before the mounting of the semiconductor element.

In the first aspect of the present invention, it is preferred that in the heating step, the circuit board is heated using the reflow device.

To attain the above object, in a second aspect of the present invention, there is provided a semiconductor manufacturing apparatus that impregnates a fiber base material with a resin to manufacture a circuit board with a thickness of not more than 500 μm, mounts a semiconductor element on the circuit board, encapsulates at least an upper portion and side faces of the mounted semiconductor element using a encapsulation resin composition, and attaches solder balls to a surface of the circuit board opposite to a surface thereof with the semiconductor device mounted thereon using a reflow device, comprising a heating step of heating the circuit board at a higher temperature than a glass transition temperature of the resin with which the fiber base material is impregnated after being cured before the attachment of the solder balls.

To attain the above object, in a third aspect of the present invention, there is provided a circuit board with a thickness of not more than 500 µm having a fiber base material in a core portion, the circuit board being applied to a semiconductor device comprising the circuit board, a semiconductor element mounted on one of surfaces of the circuit board, and a cured product of a encapsulation resin composition that encapsulates at least an upper portion and side faces of the semiconductor element, the thickness of the cured product of the encapsulation resin composition being not more than four times a thickness of the circuit board, the circuit board having a convex warp on a surface opposite to a surface on which the semiconductor element is disposed where both ends of the circuit board are regarded as reference positions, and the circuit board being heat-treated at 260° C. for one minute, and then the convex warp thereof being maintained at room temperature.

In the third aspect of the present invention, it is preferred that there is a convex warp of 0 µm to 100 µm from the reference positions on the opposite surface side.

To attain the above object, in a fourth aspect of the present invention, there is provided a semiconductor device having the above-mentioned circuit board.

BRIEF DESCRIPTION OF DRAWINGS

FIG. 1 is a cross-sectional view of a circuit board manufactured by a manufacturing method according to a first embodiment of the present invention;

FIGS. 2A to 2J are views useful in explaining a process of manufacturing the circuit board shown in FIG. 1;

FIGS. 12A and 12B are views useful in explaining warps of the semiconductor device, in which FIG. 12A shows the case that a smile warp occurs, and FIG. 12B shows the case that a cry warp occurs;

BEST MODE OF CARRYING OUT THE INVENTION

Figure 2F:
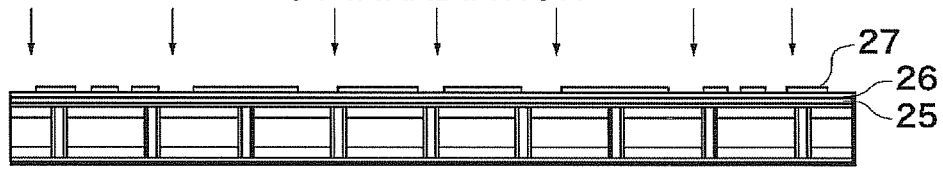

To attain the above object, the present inventors eagerly conducted research, and consequently found that in a circuit board manufacturing method applied to a semiconductor device that is manufactured by impregnating a fiber base material with a resin to manufacture a circuit board with a thickness of not more than 500 µm, mounting a semiconductor element on the circuit board, encapsulating at least an upper portion and side faces of the mounted semiconductor element using a encapsulation resin composition, and attaching solder balls to a surface of the circuit board opposite to a surface thereof with the semiconductor device mounted thereon using a reflow device, if there is a heating step of heating the circuit board at a higher temperature than a glass transition temperature of the resin with which the fiber base material is impregnated after being cured before the attachment of the solder balls, a next-generation semiconductor device can be manufactured in a stable manner, and the yield during secondary mounting processing can be improved.

Also, to attain the above object, the present inventors eagerly conducted research, and consequently found that in circuit board with a thickness of not more than 500 µm having a fiber base material in a core portion, the circuit board being applied to a semiconductor device comprising the circuit board, a semiconductor element mounted on one of surfaces of the circuit board, and a cured product of a encapsulation resin composition that encapsulates at least an upper portion and side faces of the semiconductor element, if the thickness of the cured product of the encapsulation resin composition is not more than four times a thickness of the circuit board, the circuit board has a convex warp on a surface opposite to a surface on which the semiconductor element is disposed where both ends of the circuit board are regarded as reference positions, the circuit board is heat-treated at 260° C. for one minute, and then the convex warp thereof is maintained at room temperature, distortion of the circuit board occurring due to thermal expansion during attachment of solder balls and the subsequent secondary mounting processing is small, so that a next-generation semiconductor device can be manufactured in a stable manner, and the yield in secondary mounting processing can be improved.

The present invention has been developed based on the above findings.

A description will now be given of an embodiment of the present invention with reference to the drawings.

FIG. 1 is a cross-sectional view of a circuit board manufactured by a manufacturing method according to an embodiment of the present invention.

Referring to FIG. 1, first, a circuit board 11 has a prepreg 12 as a board material therefor, a conductor layer 14, and a wiring pattern 15, and has a total thickness of 230 µm. It should be noted that although in the present embodiment, the total thickness of the circuit board 11 is 230 µm, the thickness of the circuit board 11 is not limited to this as long as the circuit board 11 is a thin board used as a next-generation circuit board. Specifically, the total thickness of the circuit board 11 is preferably 25 µm to 500 µm, and more preferably 60 µm to 400 µm. If the thickness lies inside the above ranges, warp caused particularly by heating of the circuit board 11 can be significantly reduced.

FIGS. 2A to 2J are views useful in explaining a process of manufacturing the circuit board 11 shown in FIG. 1.

First, a resin composition with which a glass cloth as a fiber base material is to be impregnated is prepared.

The resin composition with which the glass cloth is to be impregnated is not particularly limited as long as it has a high glass-transition temperature and an appropriate strength, but it is preferred that the resin composition contains a thermosetting resin. This can improve the heat resistance of the prepreg 12.

Examples of the thermosetting resin include phenol resins such as novolac type phenol resins e.g. a phenol novolac resin, a cresol novolac resin, and a bisphenol A novolac resin, and resol type phenol resins e.g. a native resol phenol resin and an oil-modified resol phenol resin modified by wood oil, flaxseed oil, walnut oil, or the like, bisphenol type epoxy resins such as a bisphenol A type epoxy resin, a bisphenol F type epoxy resin, a bisphenol F type epoxy resin, a bisphenol S type epoxy resin, a bisphenol E type epoxy resin, a bisphenol M type epoxy resin, a bisphenol P type epoxy resin, and a bisphenol Z type epoxy resin, novolac type epoxy resins such as a phenol novolac type epoxy resin and a cresol novolac epoxy resin, epoxy resins such as a biphenyl type epoxy resin, a biphenyl aralkyl type epoxy resin, an aryl alkylene type epoxy resin, a naphthalene type epoxy resin, an anthracene type epoxy resin, a phenoxy type epoxy resin, a dicyclopentadiene type epoxy resin, a norbornene type epoxy resin, an adamantane type epoxy resin, and a fluorene type epoxy resin, a urea resin, a resin having a triazine ring such as a melamine resin, an unsaturated polyester resin, a bismaleimide resin, a polyurethane resin, a diallyl phthalate resin, a silicon resin, a resin having a benzo oxazine ring, and a cyanate resin.

One type of these may be used alone, two or more types of these having different average molecular weights may be used in combination, or one type or two or more types of these may be used in combination with prepolymers thereof.

Moreover, among these, the cyanate resin (including a prepolymer of the cyanate resin) is preferably used. This can reduce the coefficient of thermal expansion of the prepreg 12, and further enable the prepreg 12 to have excellent electrical characteristics (a low dielectric constant and a low dielectric tangent), mechanical strength, and so on.

The cyanate resin can be obtained, for example, by causing a halogenated cyanogen compound and a phenol to react with each other, and turning a reaction product into a prepolymer using a method such as heating. Concrete examples include a novolac type cyanate resin, and bisphenol type cyanate resins such as a bisphenol A type cyanate resin, a bisphenol E type cyanate resin, a bisphenol E type cyanate resin, and a tetra methyl bisphenol F type cyanate resin. Among these, the novolac type cyanate resin is preferably used. This can improve heat resistance due to an increase in cross-linking density and flame resistance of the resin composition or the like. This is because the novolac type cyanate resin forms triazine rings after a curing reaction. Further, this is considered to be because the novolac type cyanate resin has a high percentage of benzene rings due to its structure and tends to become carbonized. Further, even in the case that the thickness of the prepreg 12 is 500 µm or less, high stiffness can be imparted to a double copper-clad laminate fabricated by curing the prepreg 12. In particular, the prepreg 12 has high stiffness at the time of heating and thus has particularly high reliability when a semiconductor chip 31 shown in FIG. 3B is mounted as described later.

An example of the novolac type cyanate resin can be expressed by the formula (1):

[Chemical formula 1]

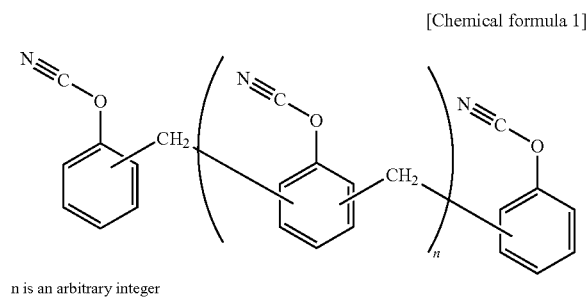

n is an arbitrary integer

The average repeating unit n of the novolac type cyanate resin expressed by the above formula (I) is not particularly limited, but is preferably 1 to 10, and more preferably 2 to 7. If the average repeating unit n is less than the above lower limit, the heat resistance of the novolac type cyanate resin may decrease, and desorption and volatilization of a low molecular weight substance may occur at the time of heating. If the average repeating unit n is more than the above upper limit, the melt viscosity may become excessively high, and the moldability of the prepreg 12 may decrease.

The average molecular weight of the cyanate resin is not particularly limited, but is preferably 500 to 4500, and more preferably 600 to 3000. If the average molecular weight is less than the above lower limit, the prepregs 12 become tacky when they are fabricated, and thus, when the prepregs 12 come into contact with each other, they may become attached to each other, and the transfer of resin may occur. If the average molecular weight is more than the above upper limit, reaction becomes too fast, and poor molding and degradation of interlaminar peel strength may occur when the circuit board 11 is formed using the prepregs 12. The average molecular weight of the cyanate resin or the like can be measured using e.g. GPC (gel permeation chromatography, standard substance: polystyrene conversion).

Moreover, although there is no particular limitation, one type of the above cyanate resins may be used alone, two or more types of the above cyanate resins having different average molecular weights may be used in combination, or one type or two or more types of the above cyanate resins may be used in combination with prepolymers thereof.

The content of the above thermosetting resin is preferably 5 to 50 percent by mass of the entire resin composition, and more preferably 20 to 40 percent by mass although there is no particular limitation. If the content is less than the above lower limit, it may difficult to form the prepreg 12, and if the content is more than the above upper limit, this may result in the decrease of the strength of the prepreg 12.

Moreover, the resin composition preferably contains an inorganic filler. This can ensure high stiffness of a laminate 20, described later, even if it is made thin (a thickness of not more than 500 µm). Further, low thermal expansion of the laminate 20 can be enhanced.

Examples of the inorganic filler include silicate such as talc, calcined clay, uncalcined clay, mica, or glass, an oxide such as a titanium oxide, alumina, silica, or molten silica, a carbonate such as a calcium carbonate, a magnesium carbonate, or a hydrotalcite, a hydroxide such as an aluminum hydroxide, a magnesium hydroxide, or a calcium hydroxide, a hydrosulfate or a sulfite such as a barium sulfate, a calcium sulfate, or a calcium sulfite, a borate such as a zinc borate, a barium metaborate, an aluminum borate, a calcium borate, or a natrium borate, a nitride such as an aluminum nitride, a boron nitride, a silicon nitride, or a carbon nitride, and a titanate such as a strontium titanate or a barium titanate. As the inorganic filler, one type of these may be used alone, or two or more types of these may be used in combination. In particular, among these, silica is preferably used, and molten silica (in particular, spherical molten silica) is preferably used because it has low thermal expansion. Examples of the shapes thereof include a shredded shape and a spherical shape, and a usage that suits a purpose is adopted, for example, spherical silica is used to lower the melt viscosity of the resin composition so as to ensure the ease with which the fiber base material is impregnated with the resin composition.

The average particle diameter of the inorganic filler is not particularly limited, but is preferably 0.01 µm to 5.0 µm, and more preferably 0.1 µm to 2.0 µm. If the particle diameter of the inorganic filler is less than the above lower limit, the viscosity of varnish is high, which may affect workability when the prepreg 12 is fabricated. If the above upper limit is exceeded, a phenomenon such as settlement of the inorganic filler in varnish may occur. The average particle diameter can be measured using, for example, a particle size distribution meter (manufactured by HORIBA, LA-500).

Moreover, although there is no particular limitation, an inorganic filler that contains particles of the same size or an inorganic filler that contains particles of different sizes may be used as the inorganic filler. Further, one type or two or more types of inorganic fillers that contain particles of the same size and/or inorganic fillers that contain particles of different sizes may be used in combination.

Further, spherical silica (in particular, spherical molten silica) with an average particle diameter of 5.0 μm or less is preferably used, and in particular, spherical molten silica with an average particle diameter of 0.01 μm to 2.0 μm is preferably used. This can improve the ease of filling the inorganic filler.

The content of the inorganic filler is not particularly limited, but is preferably 20 to 80 percent by mass of the entire resin composition, and more preferably 30 to 70 percent by mass of the entire resin composition. If the content lies inside the above range, low thermal expansion and low water absorption can be realized.

If a cyanate resin (in particular, a novolac type cyanate resin) is used as the thermosetting resin, an epoxy resin (which does not substantially contain halogen atoms) is preferably used. Examples of the epoxy resin include bisphenol type epoxy resins such as a bisphenol A type epoxy resin, a bisphenol F type epoxy resin, a bisphenol E type epoxy resin, a bisphenol S type epoxy resin, a bisphenol M type epoxy resin, a bisphenol P type epoxy resin, and a bisphenol Z type epoxy resin, novolac type epoxy resins such as a phenol novolac type epoxy resin and a cresol novolac type epoxy resin, aryl alkylene type epoxy resins such as a biphenyl type epoxy resin, a xylylene type epoxy resin, and a biphenyl aralkyl type epoxy resin, a naphthalene type epoxy resin, an anthracene type epoxy resin, a phenoxy type epoxy resin, a dicyclopentadienyl type epoxy resin, a norbornene type epoxy resin, an adamantane type epoxy resin, and a fluorene type epoxy resin. One type of these may be used alone, two or more types of these having different average molecular weights may be used in combination, or one type or two or more types of these may be used in combination with prepolymers thereof. Among them, it is particularly preferred that the aryl alkylene type epoxy resin is used as the epoxy resin. This can improve solder heat resistance after moisture adsorption and frame resistance.

The aryl alkylene type epoxy resin means an epoxy resin that has one or more aryl alkylene group in a repeating unit. Examples thereof include a xylylene type epoxy resin and a biphenyl dimethylene type epoxy resin. Among these, the biphenyl dimethylene type epoxy resin is preferably used. The biphenyl dimethylene type epoxy resin can be expressed by, for example, the formula (II).

The average repeating unit n of the biphenyl dimethylene type epoxy resin expressed by the above formula (II) is not particularly limited, but is preferably 1 to 10, and more preferably 2 to 5. If the average repeating unit n is less than the above lower limit, the biphenyl dimethylene type epoxy resin tends to become crystallized and relatively decreases in solubility with respect to a general purpose solvent, and thus may become difficult to handle. If the average repeating unit n is more than the above upper limit, the liquidity of the resin degrades, which may result in poor molding.

The content of the epoxy resin is not particularly limited, but is preferably 1 to 55 percent by mass, and more preferably 2 to 40 percent by mass of the entire resin composition. If the content is less than the above lower limit, the reactivity of the cyanate resin may decrease, or the moisture resistance of an obtained product may decrease, and if the content is more than the above upper limit, heat resistance may decrease.

The average molecular weight of the epoxy resin is not particularly limited, but is preferably 500 to 20000, and more preferably 800 to 15000. If the average molecular weight is less than the above lower limit, the prepregs 12 become tacky, and if the average molecular weight is more than the above upper limit, the ease with which glass cloths are impregnated with the prepregs 12 may decrease when the prepregs 12 are fabricated, and hence uniform products may not be obtained. The average molecular weight of the epoxy resin can be measured using, for example, GPC.

If a cyanate resin (in particular, a novolac type cyanate resin) is used as the thermosetting resin, a phenol resin is preferably used. Examples of the phenol resin include a novolac type phenol resin, a resol type phenol resin, and an aryl alkylene type phenol resin. As the phenol resin, one type of these may be used alone, two or more types of these having different average molecular weights may be used in combination, or one type of or two or more types of these may be used in combination with prepolymers thereof. Among them, it is particularly preferred that the aryl alkylene type phenol resin is used. This can further improve solder heat resistance after moisture adsorption.

Examples of the aryl alkylene type phenol resin include a xylylene type phenol resin and a biphenyl dimethylene type phenol resin. The biphenyl dimethylene type phenol resin can be expressed by, for example, the formula (III).

[Chemical formula 2]

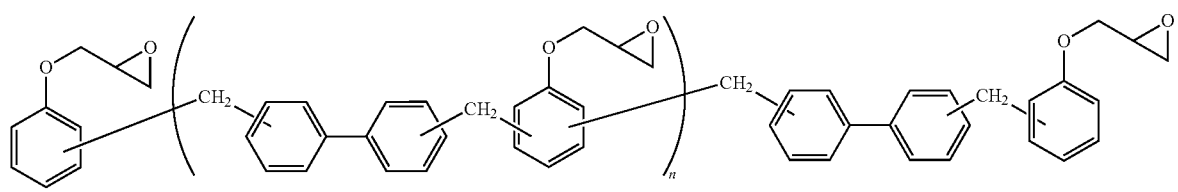

n is an arbitrary integer

[Chemical formula 3]

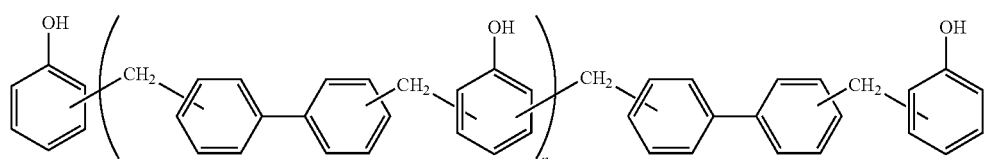

n is an arbitrary integer

The average repeating unit n of the biphenyl dimethylene type phenol resin expressed by the above formula (III) is not particularly limited, but is preferably 1 to 12, and more preferably 2 to 8. If the average repeating unit n is less than the above lower limit, heat resistance may lower. If the average repeating unit n is more than the above upper limit, the compatibility with other resins becomes lower, and thus workability may deteriorate.

A combination of the cyanate resin (in particular, the novolac type cyanate resin) and the aryl alkylene type phenol resin can control the cross-linking density, so that reactivity can be easily controlled.

The content of the phenol resin is not particularly limited, but is preferably 1 to 55 percent by mass, and more preferably, 5 to 40 percent by mass of the entire resin composition. If the content is less than the above lower limit, heat resistance may lower, and if the content is more than the above upper limit, this may result in the loss of low thermal expansion.

The average molecular weight of the phenol resin is not particularly limited, but is preferably 400 to 18000, and more preferably 500 to 15000. If the average molecular weight is less than the above lower limit, the prepregs 12 may become tacky, and if the average molecular weight is more than the above upper limit, the ease with which glass cloths are impregnated with the prepregs 12 may decrease when the prepregs 12 are fabricated, and hence uniform products may not be obtained. The average molecular weight of the phenol resin can be measured using, for example, GPC.

Further, in the case that the circuit board 11 is fabricated using a combination of the cyanate resin (in particular, the novolac type cyanate resin), the phenol resin (the aryl alkylene type phenol resin, in particular, the biphenyl dimethylene type phenol resin), and the epoxy resin (the aryl alkylene type epoxy resin, in particular, the biphenyl dimethylene type epoxy resin), especially good dimensional stability can be obtained.

It is preferred that a coupling agent is used as the resin composition although there is no particular limitation. The coupling agent improves wettability of a boundary between the thermosetting resin and the inorganic filler, thus making it possible to uniformly fix the thermosetting resin or the like and the inorganic filler to a glass cloth and improving heat resistance, in particular, solder heat resistance after moisture adsorption.

As the coupling agent, anything can be used as long as it can be ordinarily used, but specifically, one or more coupling agents selected from an epoxy silane coupling agent, a cationic silane coupling agent, an amino silane coupling agent, a titanate coupling agent, and a silicon oil type coupling agent are preferably used. This can increase the wettability of a boundary between the thermosetting resin and the inorganic filler and thus can further improve heat resistance.

The additive amount of the coupling agent depends on the surface area of the inorganic filler, and thus is not particularly limited, but is preferably 0.05 to 3 w/t parts with respect to 100 w/t parts of the inorganic filler, and more preferably 0.1 to 2 w/t parts. If the content is less than the above lower limit, the effect of improving heat resistance may deteriorate because the inorganic filler cannot be satisfactorily covered, and if the additive amount is more than the above upper limit, this may affect reaction, resulting in decreasing bending strength.

A curing accelerator may be used as the resin composition as the need arises. A well known one can be used as the curing accelerator. Examples thereof include organometallic salts such as a zinc naphthenate, a cobalt naphthenate, a stannum octylic acid, a cobalt octylic acid, a cobalt (II) bis-acetylacetonate, and a tris cobalt (III) acetylacetonate, tertiary amines such as a triethylamine, a tributyl amine, and a diazabicyclo [2, 2, 2]octane, imidazoles such as a 2-phenyl-4-methylimidazole, a 2-ethyl-4-ethylimidazole, a 2-phenyl-4-methylimidazole, a 2-phenyl-4-methyl-5-hydroxylimidazole, and a 2-phenyl-4,5-dihydroxyimidazole, phenol compounds such as a phenol, a bisphenol A, and a nonylphenol, organic acids such as an acetic acid, an acidum benzoicum, a salicylic acid, and a para-toluenesulfonic acid, and a mixture thereof. As the curing accelerator, one type including a derivative therein may be used alone, or two or more types including derivatives therein may be used in combination.

The content of the curing accelerator is not particularly limited, but is preferably 0.05 to 5 percent by mass, and more preferably 0.2 to 2 percent by mass of the entire resin composition. If the content is less than the above lower limit, a curing accelerating effect may not be obtained, and if the content is more than the above upper limit, the conservativeness of the prepreg 12 may decrease.

As the resin composition, a thermoplastic resin such as a phenoxy resin, a polyimide resin, a polyamideimide resin, a polyphenylene oxide resin, a polyether sulfonic acid resin, a polyester resin, a polyethylene resin, or a polystyrene resin, a polystyrene thermoplastic elastomer such as a styrene-butadiene copolymer or a styrene-isoprene copolymer, a thermoplastic elastomer such as a polyolefin thermoplastic elastomer, a polyamide elastomer, or a polyester elastomer, a dien elastomer such as a polybutadiene, an epoxy-modified polybutadiene, an acryl-modified polybutadiene, or a methacryl-modified polybutadiene may be used in combination.

Moreover, additives other than the above-mentioned components such as a pigment, a dye, a defoaming agent, a leveling agent, an ultraviolet absorbing agent, a blowing agent, an antioxidizing agent, a flame retardant, and an ion trapping agent may be added to the resin composition as the need arises.

After the resin composition is prepared, a glass cloth as a fiber base material is impregnated with the resin composition to fabricate the prepreg 12 (FIG. 2A). As a result, the prepreg 12 suitable for manufacturing a semiconductor device that has excellent characteristics such as dielectric characteristics and mechanical and electrical connection reliabilities in hot and humid conditions can be obtained. Commercially available examples of such a prepreg 12 include a cyanate one manufactured by Sumitomo Bakelite Co., Ltd. and a bismaleimide triazine one manufactured by Mitsubishi Gas Chemical Company, Inc. Moreover, examples of a glass constituting the glass cloth (glass fiber base material) include an E-glass, an S-glass, an NE-glass, and a T-glass.

It should be noted that although in the present embodiment, the glass cloth (glass fiber base material) is used, there is no intention to limit the present invention to this, but examples thereof include a synthetic fiber base material comprised of a woven cloth or unwoven cloth composed mainly of polyamide resin fibers such as polyamide resin fibers, aromatic polyamide resin fibers, or wholly aromatic polyamide resin fibers, polyester resin fibers such as polyester resin fibers, aromatic polyester resin fibers, or wholly aromatic polyester resin fibers, polyimide resin fibers, fluorine resin fibers, or the like, and an organic fiber base material such as a paper base material composed mainly of craft paper, cotton linter paper, mixed paper of linters and craft pulps, or the like. This can improve the strength and water absorption of the prepreg 12. Also, the coefficient of thermal expansion of the prepreg 12 can be decreased.

Examples of a method to impregnate the glass cloth with the resin composition in the present embodiment include a method in which resin varnish is prepared using the above described resin composition, and a glass cloth is immersed in the resin varnish, a method in which coating is carried out using various coaters, and a method in which spraying is carried out using a spray. Among these, the method in which the glass cloth is immersed in the resin varnish is preferably used. This can increase the ease with which the glass cloth is impregnated with the resin composition. In the case that the glass cloth is immersed in the resin varnish, ordinary impregnation coating equipment may be used.

It is preferred that a solvent used in the resin varnish exhibits satisfactory solubility in resin components in the resin composition, but a poor solvent may be used within a scope which does not produce any adversely effects. Examples of the solvent that exhibits satisfactory solubility include an acetone, a methyl ethyl ketone, a methyl isobutyl ketone, a cyclohexanone, a tetrahydrofuran, a dimethylhormamide, a dimethylacetamide, a dimethylsulfoxide, an ethylene glycol, cellusolves, and carbitols.

The solid content of the resin varnish is not particularly limited, but is preferably 40 to 80 percent by mass of the resin composition, and more preferably 50 to 65 percent by mass of the resin composition. This can further increase the ease with which the glass cloth is impregnated with the resin composition. By impregnating the glass cloth with the resin composition and drying the same at a predetermined temperature, for example, 80° C. to 200° C., the prepreg 12 can be obtained.

After the prepreg 12 is fabricated, copper foils 23 are overlaid on both sides of the prepreg 12, and then they are heated and pressurized to fabricate the double copper-clad laminate 20 (hereinafter referred to merely as the "laminate 20") (FIG. 2B). As a result, the laminate having excellent dielectric characteristics and high mechanical and electrical connection reliabilities under hot and humid conditions can be obtained.

Although in the laminate 20 of the present embodiment, the copper foils 23 are overlaid on both of the upper and lower sides of one prepreg 12, metallic foils or films other than the copper foils 23 may be overlaid on the prepreg 12. Moreover, two or more prepregs 12 may be stacked. If two or more prepregs 12 are stacked, metallic foils or films are overlaid on both or one of the outermost upper and lower sides of the stacked prepregs 12. The heating temperature during the fabrication of the laminate 20 is not particularly limited, but is preferably 120° C. to 220° C., and more preferably 150° C. to 200° C. Moreover, the pressure for pressurization is not particularly limited, but is preferably 2 MPa to 5 MPa, and more preferably 2.5 MPa to 4 MPa.

Examples of a metal constituting the metallic foils include a copper-based alloy, aluminum or an aluminum-based alloy, silver or a silver-based alloy, gold or a gold-based alloy, zinc or a zinc-based alloy, nickel or a nickel-based alloy, tin or a tin-based alloy, and iron or an iron-based alloy. Examples of the films include a polyethylene, a polypropylene, a polyethylene terephthalate, a polyimide, and a fluorine-based resin.

After the laminate 20 is fabricated, through holes 21 are formed at desired locations thereof using, for example, a mechanical drill (FIG. 2C), and then the interiors of the through holes 21 and the surfaces of the copper foils 23 are coated with thin electroless copper 24 with a thickness of 1 $\mu$m by electroless copper plating (FIG. 2D). This forms the conductor layer 14 (FIG. 1). Further, panel plating is carried out in which copper 25 with a thickness of not less than 10 $\mu$m is thickly plated by electrolyte copper plating on a chip mounting side, described later, of the electroless copper 24 (FIG. 2E). It should be noted that although in the present embodiment, the thickness of the electroless copper 24 is 1 $\mu$m, and the thickness of the copper 25 is not less than 10 $\mu$m, the present invention is not limited to this.

Figure 2G:
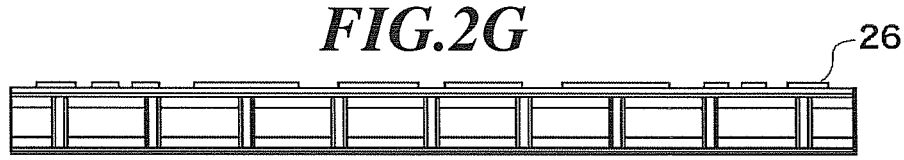
Figure 2H:

Then, after a resist 26 is coated on a surface of the copper 25, a mask 27 of a circuit pattern is overlaid on the resist 26, and UV exposure is carried out (FIG. 2F). For example, if the resist 26 is of a positive type, the resist 26 is developed using a developing agent containing an organic solvent so that a portion of the resist 26 which has not been irradiated with UV (unexposed portion) remains as a wiring pattern (FIG. 2G).

Figure 2I:

After that, the copper 25 in an exposed portion is removed through, for example, wet etching using the patterned resist 26 as a mask (FIG. 2H), and then the resist 26 is separated and removed to form a desired wiring pattern 15 on the chip mounting side of the prepreg 12 (FIG. 2I).

Then, by carrying out heat treatment using a reflow device used for reflowing in FIG. 3D, described later (FIG. 2J), the circuit board 11 in FIG. 1 is formed. Thus, the circuit board 11 can be easily and reliably heated.

FIGS. 3A to 3E are views useful in explaining a process of manufacturing a semiconductor device using the circuit board 11.

Figure 3A:
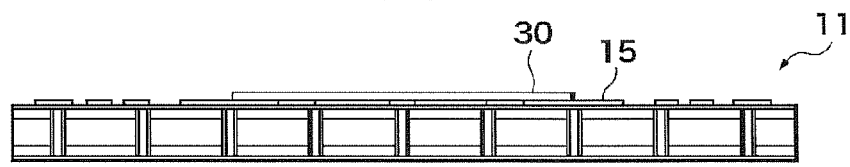
FIGS. 3A to 3E are views useful in explaining a process of manufacturing a semiconductor device using the circuit board.
Figure 3B:
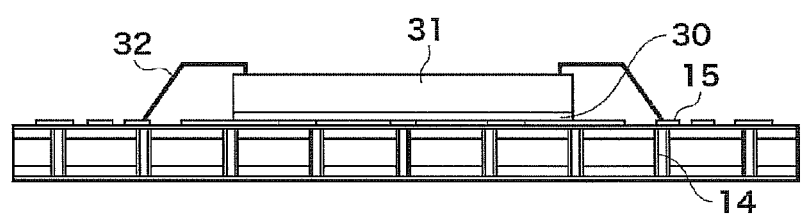

Referring to FIG. 3A, first, an adhesive 30 such as an epoxide-based resin is coated on a chip mounting area of the wiring pattern 15 of the circuit board 11. Then, the semiconductor chip 31 is adhered to the chip mounting area by the adhesive 30 with a back surface (a surface opposite to a surface on which an electrode is formed) of the semiconductor chip 31 to be mounted down, and then, the electrode of the semiconductor chip 31 and the conductor layer 14 are electrically connected together using bonding wires 32 of, for example, Au via the wiring pattern 15 (FIG. 3B).

Figure 3C:
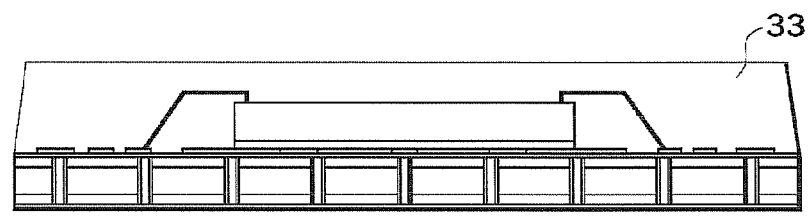

Next, the semiconductor chip 31 and the bonding wires 32 are encapsulated by a encapsulation resin 33 and then heated so that the encapsulation resin 33 is cured (FIG. 3C). Here, the encapsulation resin 33 has only to encapsulate at least an upper portion and side faces of the semiconductor chip 31, more specifically, the bonding wires 32, and is not limited to a form that encapsulates the entire chip mounting surface of the circuit board 11 as shown in FIG. 3C. It should be noted that in the present embodiment, the thickness of the encapsulation resin 33 after being cured is 600 $\mu$m, which is 2.6 times of the 230 $\mu$m thickness of the circuit board 11, but is not limited to this as long as it is four times or less the thickness of the circuit board 11 that can be used for a next-generation semiconductor device.

When a warp in the circuit board 11 after the encapsulation resin 33 being cured was measured with both ends thereof regarded as reference positions, there was a convex warp, that is, a so-called smile warp on the side of the circuit board 11 opposite to the surface on which the semiconductor chip 31 was disposed. Further, it was found that the smile warp is maintained at room temperature after the circuit board 11 in which there is the smile warp is subjected to heat treatment at 260° C. for one minute. Moreover, the smile warp is a warp of 0 μm to 100 μm, and hence distortion of the circuit board caused by thermal expansion during attachment of solder balls and subsequent secondary mounting processing can be reliably reduced.

After that, Pb-free solder balls 34 (melting point: 217° C.) are placed on the side of the circuit board 11 opposite to the chip mounting surface, and the solder balls 34 are joined to the circuit board 11 by carrying out reflow processing using the reflow device (FIG. 3D), so that a semiconductor device is manufactured. In the reflow processing, the temperature of the reflow device is set so that its maximum temperature can be 260° C.

Further, by secondarily mounting the semiconductor device on a board 35 (FIG. 3E), an electronic device is manufactured.

Figure 2J:
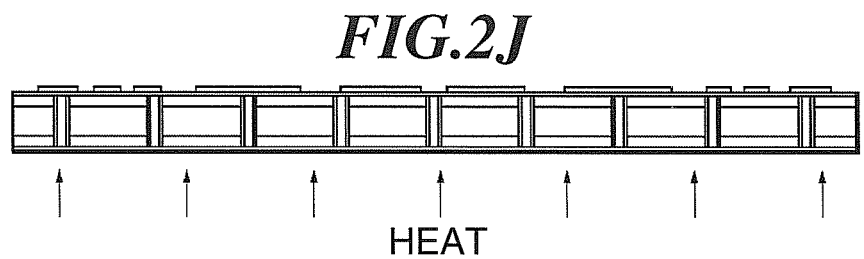

Here, the maximum temperature of the reflow device in the heat treatment in FIG. 2J is set to be higher than a glass transition temperature of a resin composition that constitutes the prepreg 12, and a glass cloth is impregnated with the resin composition after it is cured. The maximum temperature of the reflow temperature is not particularly limited, but is preferably not less than 20° C., particularly not less than 40° C. higher than the glass transition temperature of the resin composition which has been cured the glass cloth being impregnated with the resin composition before being cured. It should be noted that the glass transition temperature is measured by cutting the cured product of the resin composition into a size of 4 mm×20 mm to use it as an evaluation sample and measuring the temperature thereof while raising it at 10° C./min using a Thermo Mechanical Analysis device (TMA) (manufactured by TA Instruments, Inc.)

This can reduce internal stress in the circuit board 11. As a result, even in the case of a thin type having a thickness of not more than 500 μm such as the circuit board 11, changes in warp in the circuit board 11 occurring before and after the reflow processing in FIG. 3D can be reduced, and the secondary mounting in FIG. 3E can be suitably carried out.

Moreover, as a heating temperature profile of the reflow device in the heat treatment in FIG. 2J, for example, JEDEC standard J-STD-020C of (July 2004) can be used, and its maximum temperature is set according to the melting point of the solder balls 34. Specifically, if the solder balls 34 are eutectic solders (melting point of 183° C.), the maximum temperature is set to 225° C. to 240° C., and if the solder balls 34 are Pb-free solders (melting point of 217° C.), the maximum temperature is set to 245° C. to 260° C. That is, it is preferred that the maximum temperature of the circuit board 11 in the heat treatment in FIG. 2J is set to be within a range of not less than the melting point of the solder balls 34 and not more than 80° C. plus the melting point of the solder balls 34. If the maximum temperature is not more than the melting point of the solder balls 34, changes in warp in the circuit board 11 occurring before and after the reflow processing cannot be substantially prevented, and if the maximum temperature is as high as not less than 80° C. plus the melting point of the solder balls 34, this is not desirable because the resin composition included in the circuit board 11 is thermally deteriorated.

The heat treatment is not limited to the one using the reflow device, and may be carried out using methods such as oven heating and heat platen pressing. A method in which the board is put into an oven or a heat platen pressing set to a heating temperature, and a method in which the board is put into an oven or a heat platen pressing set to a heating temperature lower than a heating temperature and then heated.

Figure 3D:
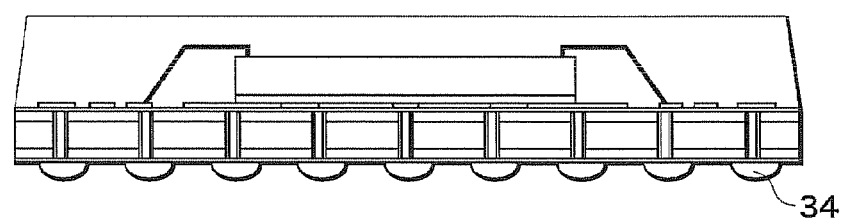

Moreover, although in the present embodiment, the heat treatment in FIG. 2J is carried out before the mounting of the semiconductor chip 31, the present invention is not limited to this as long as the heat treatment in FIG. 2J is carried out before the reflow processing in FIG. 3D. However, a crack or the like in the cured product of the resin composition 33 caused by heating can be prevented, and changes in warp in the circuit board 11 occurring before and after the reflow processing in FIG. 3D can be reliably reduced, and therefore, the heat treatment in FIG. 2J is most preferably carried out before the mounting of the semiconductor chip 31 as in the present embodiment.

Figure 3E:
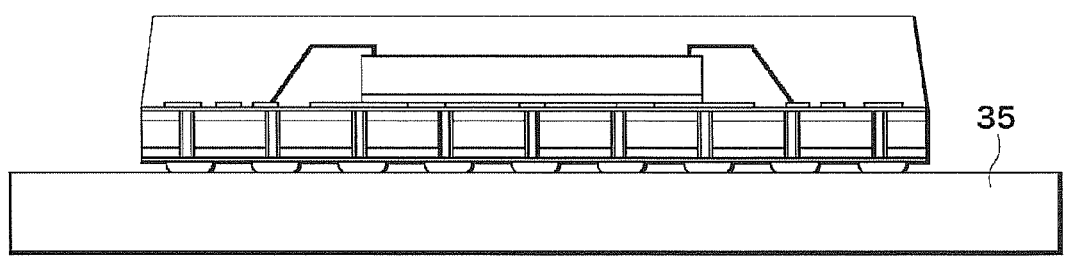

According to the present embodiment, because the warp in the circuit board 11 after the reflow processing in FIG. 3D is made to be a smile warp by carrying out the heating treatment in FIG. 2J, the yield during the secondary mounting in FIG. 3E improves. Here, if the warp in the circuit board 11 after the reflow processing in FIG. 3D is a cry warp, the solder balls 34 disposed at ends of the circuit board 11 may contact the adjacent solder balls 34 and short out during the secondary mounting in FIG. 3E, resulting in deteriorating the yield.

Moreover, according to the present embodiment, because the thickness of the cured product of the encapsulation resin 33 that encapsulates the semiconductor chip 31 and the bonding wires 32 through the processing in FIG. 3C is four times or less the thickness of the circuit board 11, a smile warp occurs in the circuit board 11 after the processing in FIG. 3C, the circuit board 11 in which the smile warp has occurred is heat-treated at 260° C. for one minute, and the smile warp is maintained at room temperature, the amount of distortion in the circuit board 11 caused by thermal expansion during the solder ball attachment processing in FIG. 3D and the secondary mounting processing in FIG. 3E is small, and hence a next-generation semiconductor device can be manufactured in a stable manner, and the yield during the secondary mounting improves.

EXAMPLES

Next, examples and comparative examples of the present invention will be described, but the present invention is not limited to them.

Experiment 1

(1) Preparation of Resin Varnish 19.7 parts by weight of a novolac type cyanate resin (manufactured by Lonza Japan Ltd., Primaset PT-30, average molecular weight of about 700), 11 parts by weight of a biphenyl dimethylene type epoxy resin (manufactured by Nippon Kayaku Co., Ltd., NC-3000H, epoxy equivalent of 275), 9 parts by weight of a biphenyl dimethylene type phenol resin (manufactured by Meiwa Plastic Industries Co., Ltd., MEH-7851-3H, hydroxyl equivalent of 230), and 0.3 parts by weight of an epoxy silane coupling agent (manufactured by GE Toshiba Silicones Co., Ltd., A-187) were dissolved in a methyl ethyl ketone at room temperature, 60 parts by weight of a spherical molten silica (manufactured by Admatechs Co., Ltd., a spherical molten silica, SO-25R, average particle diameter of 0.5 μm) was added to them, and they were agitated for ten minutes using a high-speed agitator to obtain resin varnish.

(2) Manufacturing of Prepreg

A glass cloth (thickness of 94 μm, manufactured by Nitto Boseki, Co., Ltd., WEA-2116) was impregnated with the above described resin varnish, and they were dried in a furnace at 150° C. for two minutes to obtain a cyanate-based prepreg with a varnish solids content of about 50 percent by mass.

(3) Manufacturing of Laminate

Copper foils of 18 μm were overlaid on both sides of the above described prepreg, and they were molded by heat pressing at a pressure of 4 MPa and a temperature of 200° C. for two hours to obtain a laminate with a thickness of 0.2 mm. After the heat curing, the glass transition temperature of the above cyanate-based prepreg was 220° C.

(4) Fabrication of Circuit Board

Ten circuit boards having wiring patterns were fabricated using the laminate manufactured by the above method. Among the circuit boards thus fabricated, five ones were heated at a maximum temperature of 260° C. by a reflow device (manufactured by Heller Industries, Inc., 1812EXL-S) for which a heating temperature profile in FIG. 13 was set (Example 1), and the rest five ones were not subjected to such heating (Comparative Example 1).

Then, post mold curing (hereinafter referred to as the "PMC") was carried out in which semiconductor chips were mounted on the respective circuit boards in Example 1 and Comparative Example 1 and connected together via bonding wires, and then the semiconductor chips and the bonding wires were encapsulated by a encapsulation resin with a thickness of 0.6 mm and heated at 175° C. for four hours to be cured.

Figure 13:
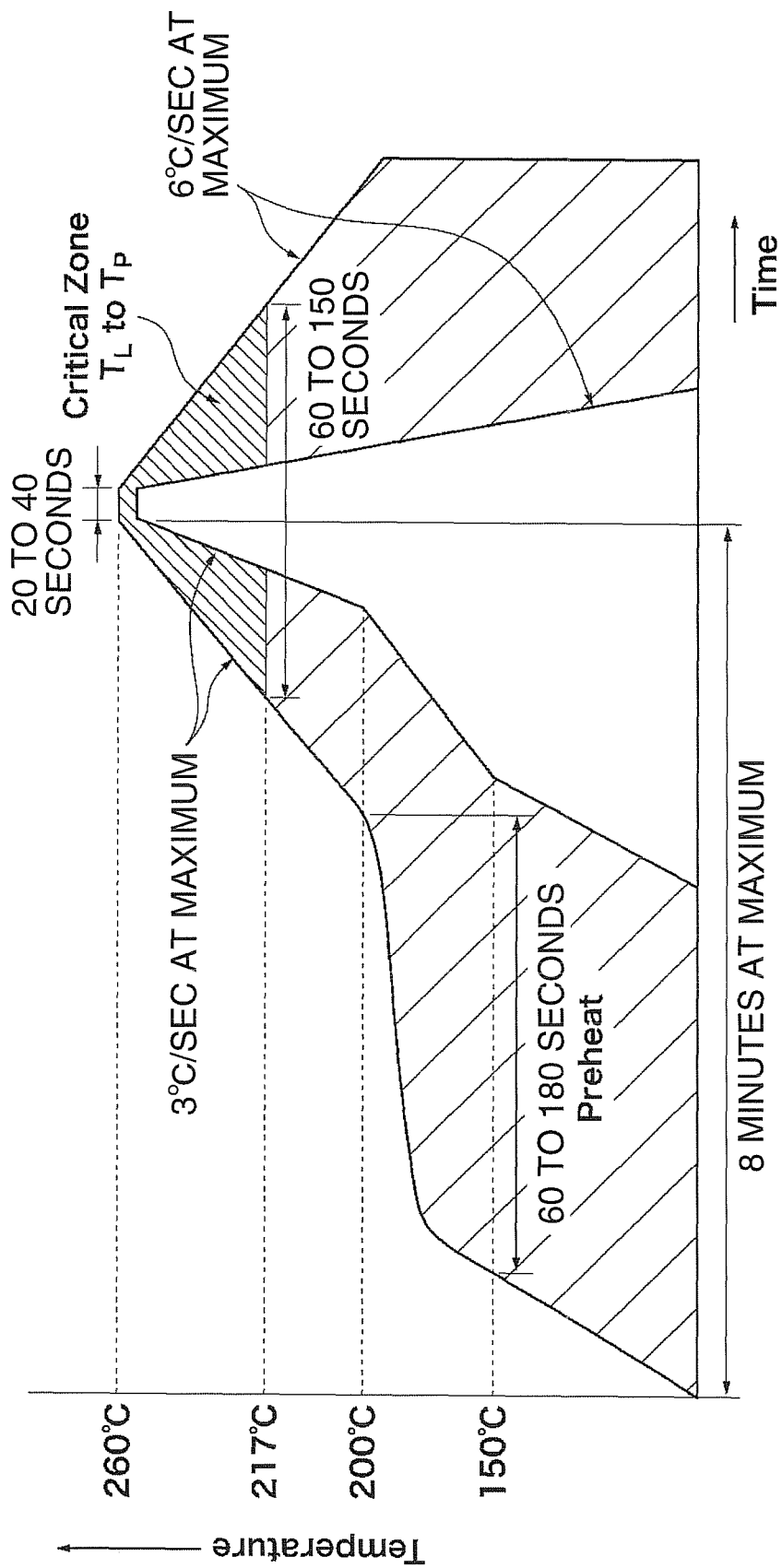
FIG. 13 is a graph showing a heating temperature profile at the time of heating processing.

Then, Pb-free solder balls (manufactured by Senju Metal Industry Co., Ltd., melting point of 217° C.) were placed on rear sides of the circuit boards and subjected to reflow processing in which they were heated under the heating conditions in FIG. 13 by the reflow device. Then, they were subjected to secondary mounting and dry processing in which they were heated and dried at 150° C. for eight hours.

The amount of warp in each sample was measured through laser scanning before and after the PMC processing, after the reflow processing, and after the dry processing. Here, the amount of warp means the surface height of each sample in the case that both ends of the sample are regarded as reference positions, and was calculated from the average value of five samples.

Figure 4:
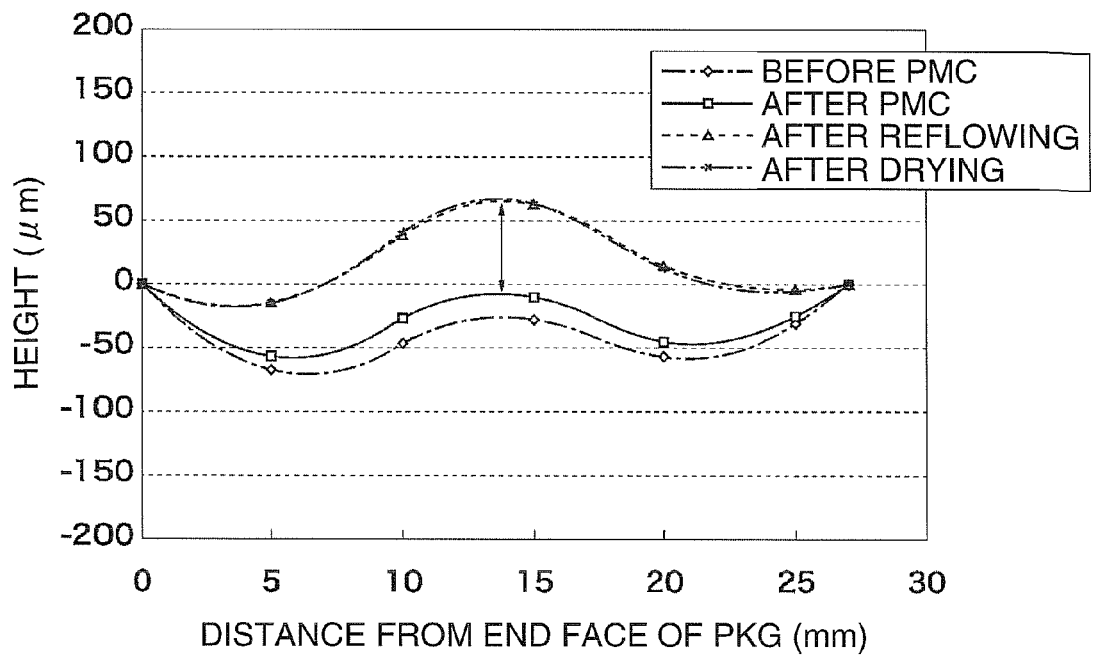
FIG. 4 is a graph showing the amount of warp in Comparative Example 1.
Figure 5:
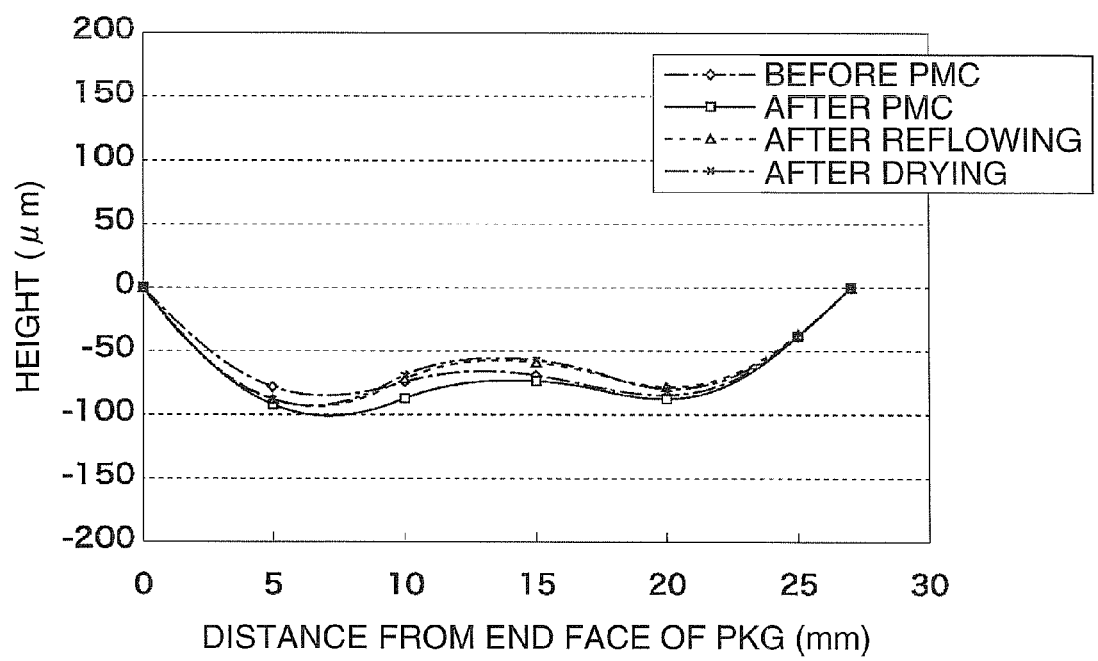
FIG. 5 is a graph showing the amount of warp in Example 1.

As a result, it was found that in Comparative Example 1, a smile warp occurred but a cry warp occurred after the reflow processing as shown in FIG. 4, and thus a great change in warp occurred before and after the reflow processing. On the other hand, it was found that in Example 1, there was almost no change in warp before and after each processing as shown in FIG. 5, and a smile warp was maintained.

Experiment 2

The cyanate-based prepreg fabricated as described above was replaced with a bismaleimide triazine-based prepreg (manufactured by Mitsubishi Gas Chemical Company, Inc., HL832HS), and the same experiment as Experiment 1 was conducted. After the heat curing described, the glass transition temperature of the bismaleimide triazine-based prepreg was 185° C. Among circuit boards fabricated in this experiment, five ones were heated at a maximum temperature of 260° C. by a reflow device for which the above described heating temperature profile in FIG. 13 was set (Example 2), and the rest five ones were not subjected to such heating (Comparative Example 2).

Figure 6:
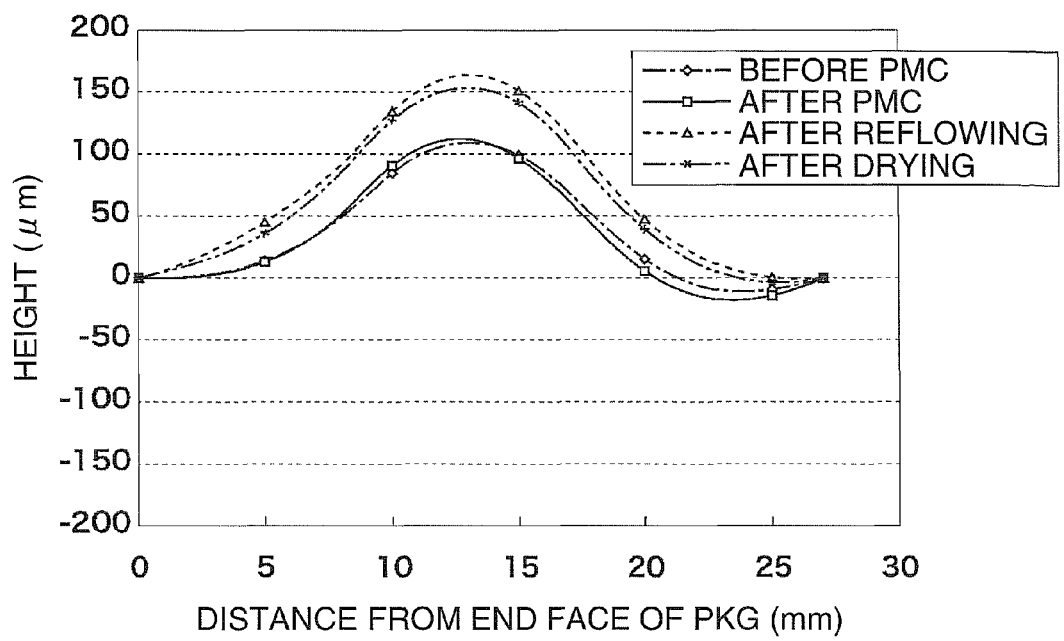
FIG. 6 is a graph showing the amount of warp in Comparative Example 2.
Figure 7:
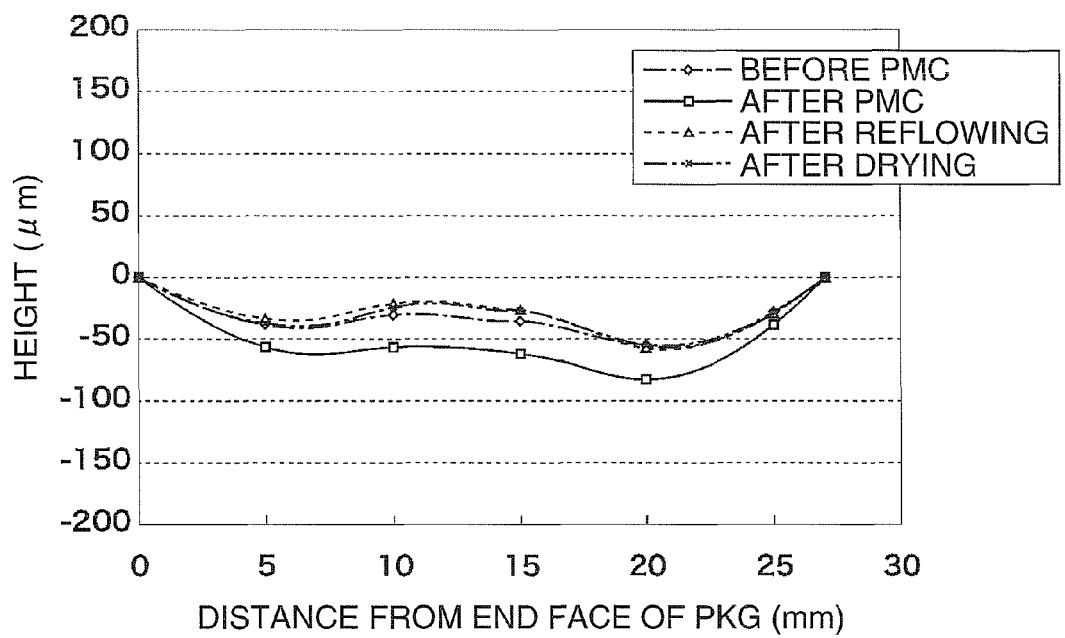
FIG. 7 is a graph showing the amount of warp in Example 2.

As a result of Experiment 2, it was found that in Comparative Example 2, the amount of warp in a sample in which there was a cry warp before the PMC processing further increased after the reflow processing as shown in FIG. 6. On the other hand, it was found that in Example 2, there was a smile warp before the PMC processing, and there was almost no change in warp before and after each processing as shown in FIG. 7.

Experiment 3

The thickness of the encapsulation resin in Experiment 1 was changed to a thickness of 1.2 mm, and five samples subjected to the heating processing were fabricated in Example 3, and five samples not subjected to the heating processing were fabricated in Comparative Example 3. Similarly, the thickness of the encapsulation resin in Experiment 2 was changed to a thickness of 1.2 mm, and five samples subjected to the heating processing were fabricated in Example 4, and five samples not subjected to the heating processing were fabricated in Comparative Example 5.

Figure 8:
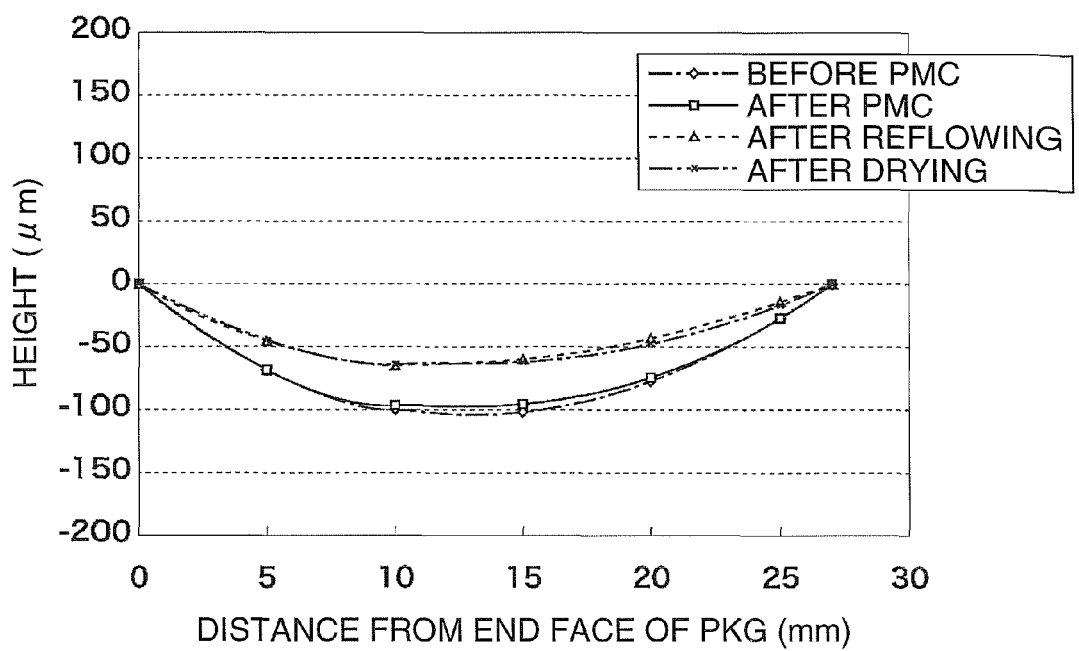
FIG. 8 is a graph showing the amount of warp in Comparative Example 3.
Figure 10:
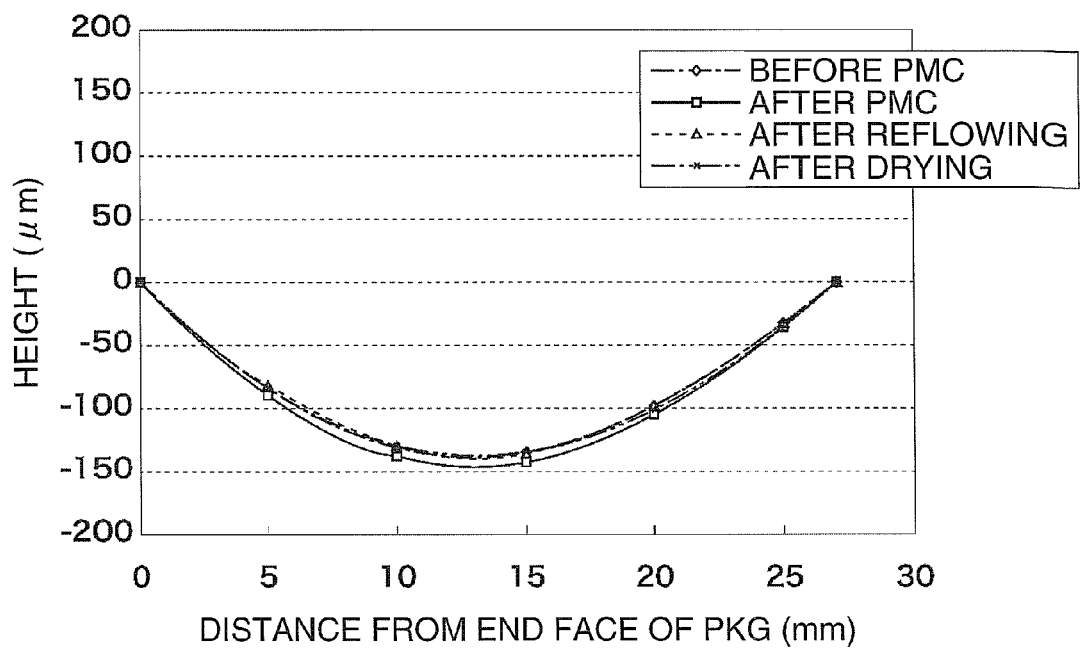
FIG. 10 is a graph showing the amount of warp in Example 3.

As a result, it was found that in Comparative Example 3, there was a smile warp before the PMC processing, but the amount of warp greatly changed before and after the reflow processing as shown in FIG. 8. On the other hand, it was found that in Example 3, the warp amount of a smile warp was larger than in Comparative Example 3 before the PMC processing, but there was almost no change in warp before and after each processing as shown in FIG. 10.

Figure 9:
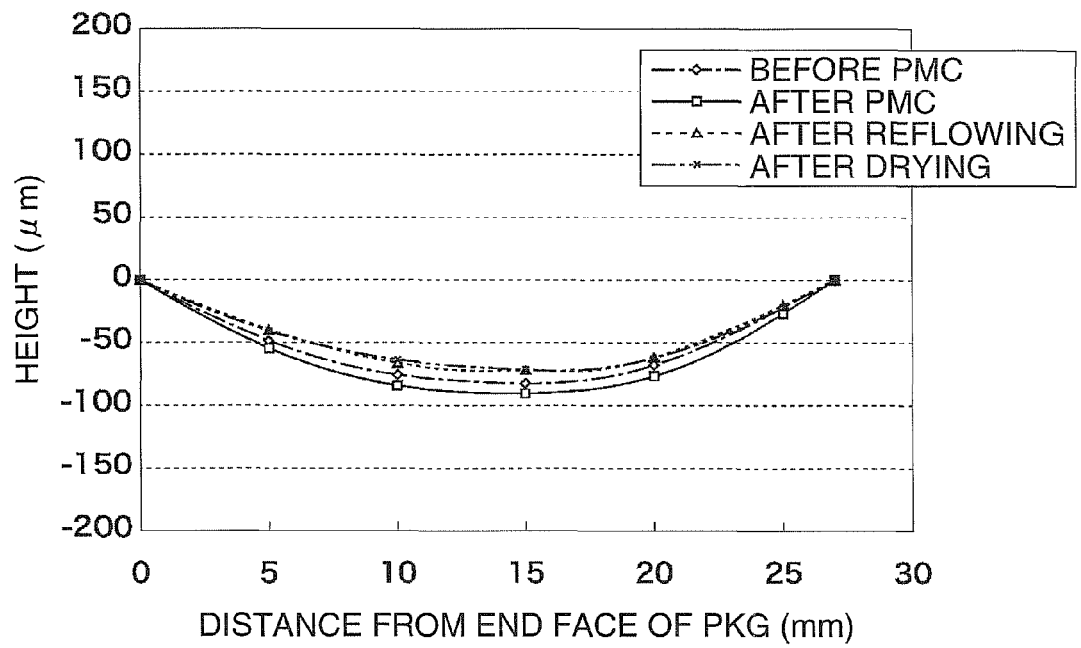
FIG. 9 is a graph showing the amount of warp in Comparative Example 4.
Figure 11:
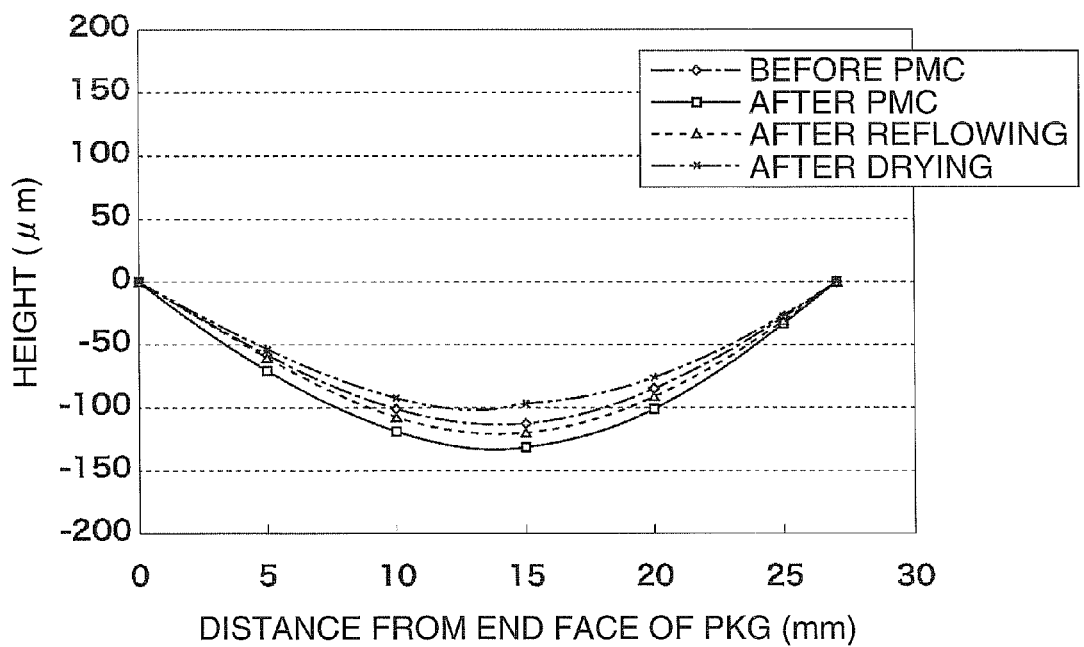
FIG. 11 is a graph showing the amount of warp in Comparative Example 5.
Figure 12A:
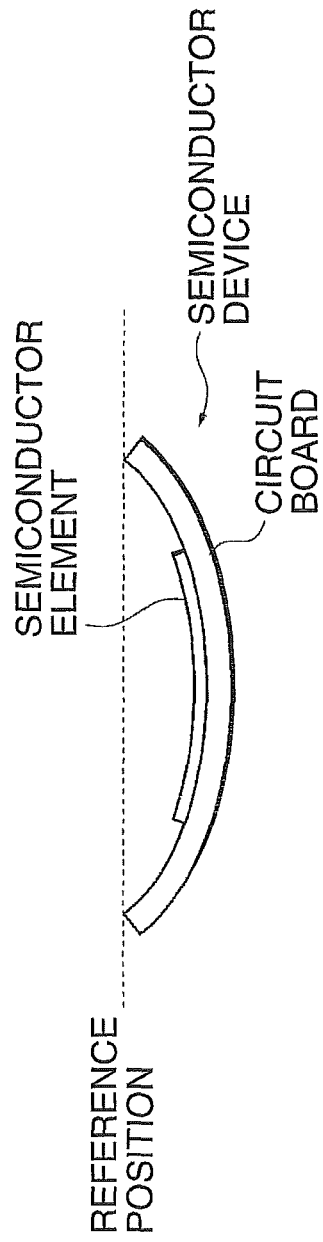
Figure 12B:
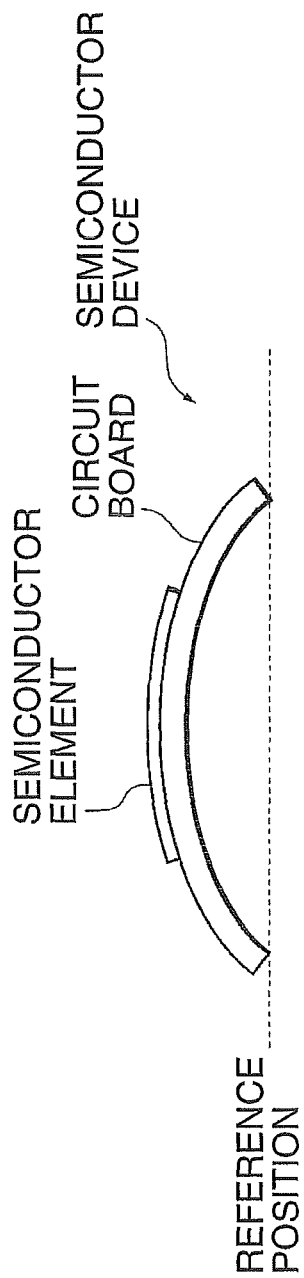

On the other hand, it was found that in Comparative Examples 4 and 5, a change in warp occurred before and after each processing irrespective of whether or not the heating processing was carried out as shown in FIGS. 9 and 11.

As a result of the foregoing, it was found that when the thickness of the encapsulation resin is 0.6 mm, both the amount of warp and the change in warp can be reduced by carrying out the heating processing before mounting of a semiconductor chip in both the case that the prepreg is the cyanate-based one and the prepreg is the bismaleimide triazine-based one.

Moreover, it was found that when the thickness of the encapsulation resin is 1.2 mm, the change in warp can be reduced by carrying out the heating processing only in the case that the prepreg is the cyanate-based one.

Experiment 4

(1) Preparation of Resin Varnish 19.7 parts by weight of a novolac type cyanate resin (manufactured by Lonza Japan Ltd., Primaset PT-30, average molecular weight of about 700), 11 parts by weight of a biphenyl dimethylene type epoxy resin (manufactured by Nippon Kayaku Co., Ltd., NC-3000H, epoxy equivalent of 275), 9 parts by weight of a biphenyl dimethylene type phenol resin (manufactured by Meiwa Plastics Industries Co., Ltd., MEH-7851-3H, hydroxyl equivalent of 230), and 0.3 parts by weight of an epoxy silane coupling agent (manufactured by GE Toshiba Silicones Co., Ltd., A-187) were dissolved in a methyl ethyl ketone at room temperature, 60 parts by weight of a spherical molten silica (manufactured by Admatechs Co., Ltd., a spherical molten silica, SO-25R, average particle diameter of 0.5 μm) was added to them, and they were agitated for ten minutes using a high-speed agitator to obtain resin varnish.

(2) Manufacturing of Prepreg

A glass cloth (thickness of 94 μm, manufactured by Nitto Boseki, Co., Ltd., WEA-2116) was impregnated with the above described resin varnish, and they were dried in a furnace at 150° C. for two minutes to obtain a cyanate-based prepreg with a varnish solids content of about 50 percent by mass.

(3) Manufacturing of Laminate

Copper foils of 18 μm were overlaid on both sides of the above described prepreg, and they were molded by heat pressing at a pressure of 4 MPa and a temperature of 200° C. for two hours to obtain a laminate with a thickness of 0.23 mm. After the heat curing, the glass transition temperature of the above cyanate-based prepreg was 220° C.

(4) Fabrication of Circuit Board

Ten circuit boards having wiring patterns were fabricated using the laminate manufactured by the above method. Among the circuit boards thus fabricated, five ones were heated at a maximum temperature of 260° C. by a reflow device (manufactured by Heller Industries, Inc., 812EXL-S) (Example 4) for which the heating temperature profile as shown in FIG. 13 was set, and the rest five ones were not subjected to such heating (Comparative Example 6).

Then, post mold curing (hereinafter referred to as the "PMC") was carried out in which semiconductor chips were mounted on the respective circuit boards in Example 4 and Comparative Example 6 and connected together via bonding wires, and then the semiconductor chips and the bonding wires were encapsulated by a encapsulation resin with a thickness of 0.6 mm, and heated at 175° C. for four hours to be cured.

Figure 14:
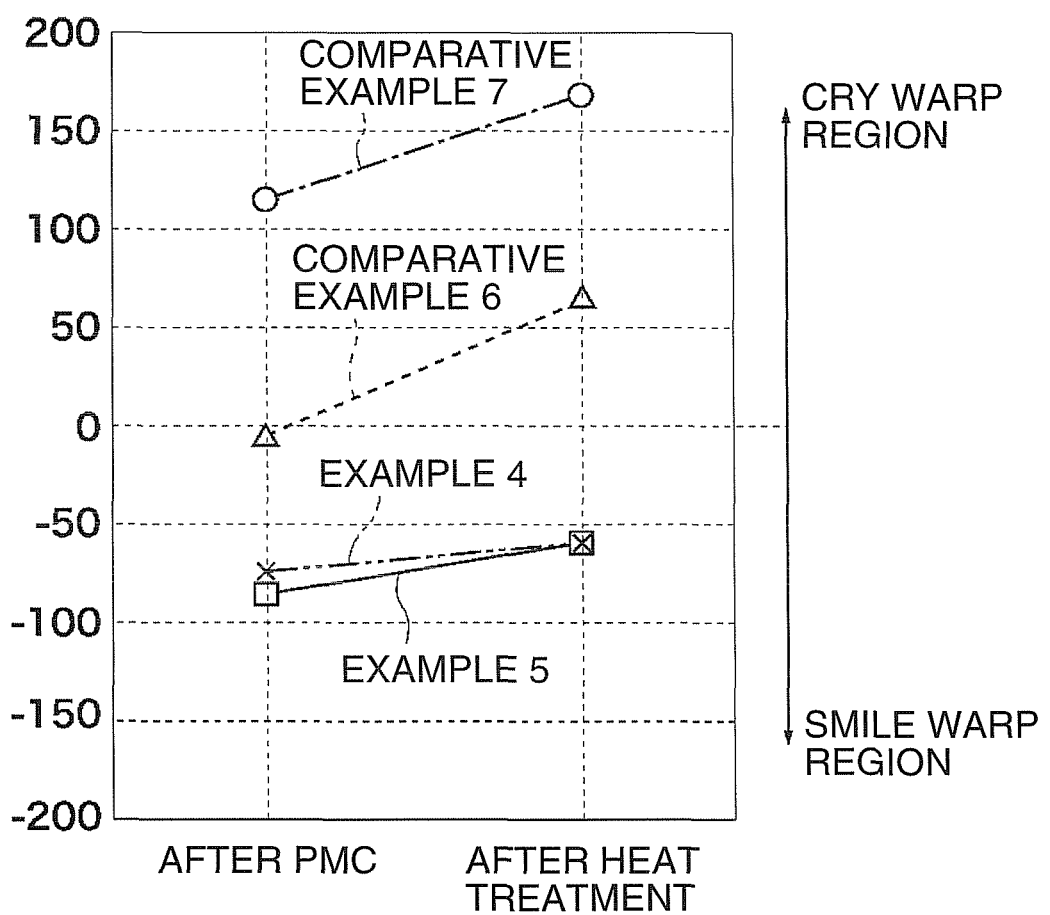
FIG. 14 is a graph showing the amounts of warp after PMC processing and after heat treatment in Examples 4 and 5 and Comparative Examples 6 and 7.

After the PMC processing, the amount of warp in each sample (circuit board) was measured through laser scanning. Here, the amount of warp means the height of each sample in the case that both ends of the sample are regarded as reference positions, and was calculated from the average value of five samples. As a result, it was found that in both Example 4 and Comparative Example 6, a smile warp occurred as shown in FIG. 14.

Next, each sample after the PMC processing was heat-treated from the rear side thereof at 260° C. for one minute by the reflow device. As a result, it was found that in Comparative Example 6, a cry warp occurred after the processing as shown in FIG. 14. On the other hand, it was found that in Example 4, the smile warp was maintained before and after the heat treatment as shown in FIG. 14.

Experiment 5

The cyanate prepreg fabricated as described above was replaced with a bismaleimide triazine-based prepreg manufactured by Mitsubishi Gas Chemical Company, Inc., and among circuit boards fabricated in a manner similar to Experiment 4, five ones were heated at a maximum temperature of 260° C. by the reflow device for which the above described heating temperature profile in FIG. 13 was set (Example 5), and the rest five ones were not subjected to such heating (Comparative Example 7). The glass transition temperature of the bismaleimide triazine-based prepreg after the above described heating curing was 185° C.

Next, after the PMC processing was carried out under the same heating conditions as those in Experiment 4, the amount of warp in each sample was measured through laser scanning.

As a result, it was found that a smile warp occurred in Example 5, and a cry warp occurred in Comparative Example 7 as shown in FIG. 5.

Then, each sample after the PMC processing was heat-treated from the rear side thereof at 260° C. for one minute by the reflow device. As a result, it was found that in Comparative Example 7, a cry warp occurred before and after the heat treatment as shown in FIG. 14. On the other hand, it was found that in Example 5, the smile warp was maintained before and after the heat treatment as shown in FIG. 14.

INDUSTRIAL APPLICABILITY

According to the circuit board manufacturing method in the first aspect of the present invention, because a circuit board with a thickness of not more than 500 μm manufactured by impregnating a fiber base material with a resin is heated at a higher temperature than a glass transition temperature of the resin with which the fiber base material is impregnated after being cured before attachment of solder balls, internal stress in the circuit board can be reduced, and even if the circuit board is a thin type with a thickness of not more than 500 μm, the change in warp of the circuit board occurring before and after reflow processing can be reduced, so that a next-generation semiconductor device can be manufactured in a stable manner, and the yield during secondary mounting processing can be improved.

According to the first aspect of the present invention, the maximum temperature of the circuit board when heated in the heating step is within a range of not less than a melting temperature of solder used in the attachment of the solder balls and not more than 80° C. plus the melting point. Thus, if the maximum temperature is higher than the melting temperature of solder, it can reliably exceed the glass transition temperature of the resin with which the fiber base material is impregnated after being cured, and hence the change in warp of the circuit board occurring before and after the reflow processing can be satisfactorily reduced. On the other hand, because the maximum temperature is not more than 80° C. plus the melting point of solder, thermal deterioration of a resin composition in the circuit board can be prevented.

According to the first aspect of the present invention, the heating step is carried out before mounting of a semiconductor element, the change in warp of the circuit board occurring before and after the reflow processing can be reliably reduced without causing a crack or the like in the cured product of a encapsulation resin composition constituting the semiconductor device due to heating.

According to the first aspect of the present invention, because the circuit board is heated using a reflow device in the heating step, the circuit board can be easily and reliably heated.

According to the circuit board manufacturing method in the second aspect of the present invention, because a circuit board with a thickness of not more than 500 μm manufactured by impregnating a fiber base material with a resin is heated at a higher temperature than a glass transition temperature of the resin with which the fiber base material is impregnated after being cured before attachment of solder balls, internal stress in the circuit board can be reduced, and even if the circuit board is a thin type with a thickness of not more than 500 μm, the change in warp of the circuit board occurring before and after reflow processing can be reduced, so that a next-generation semiconductor device can be manufactured in a stable manner, and the yield during secondary mounting processing can be improved.

According to the circuit board in a third aspect of the present invention, because the thickness of the cured product of a encapsulation resin composition is four times or less the thickness of the circuit board, there is a convex warp on a surface opposite to a surface on which a semiconductor element is disposed with both ends of the circuit board regarded as reference positions, the circuit board is heat-treated at 260° C. for one minute, and then the convex warp thereof is maintained at room temperature, distortion of the circuit board occurring due to thermal expansion during attachment of solder balls and the subsequent secondary mounting processing is small, so that a next-generation semiconductor device can be manufactured in a stable manner, and the yield in secondary mounting processing can be improved.

According to the circuit board in the third aspect of the present invention, because the circuit board has a convex warp of 0 μm to 100 μm from the reference positions to the opposite surface, a next-generation semiconductor device can be more reliably manufactured in a stable manner, and the yield during secondary mounting processing can be improved.

The invention claimed is:

1. A circuit board manufacturing method applied to a semiconductor device that is manufactured by impregnating a fiber base material with a resin to manufacture a circuit board with a thickness of not more than 500 μm, mounting a semiconductor element on the circuit board, encapsulating at least an upper portion and side faces of the mounted semiconductor element using an encapsulation resin composition, carrying out post mold curing processing for heating and curing the encapsulation resin composition, and carrying out reflow processing for attaching solder balls to a surface of the circuit board opposite to a surface thereof with the semiconductor element mounted thereon using a reflow device, characterized by comprising:
 a heating step of heating the circuit board using the reflow device at a higher temperature than a glass transition temperature of a cured product of the resin with which the fiber base material is impregnated, before mounting the semiconductor element on the circuit board.

2. The manufacturing method as claimed in claim 1, characterized in that a maximum temperature of the circuit board when heated in said heating step is within a range of not less than a melting temperature of solder used in the attachment of the solder balls and not more than 80° C. plus the melting point.

3. A semiconductor manufacturing apparatus for manufacturing a semiconductor device by impregnating a fiber base material with a resin to manufacture a circuit board with a thickness of not more than 500 μm, mounting a semiconductor element on the circuit board, encapsulating at least an upper portion and side faces of the mounted semiconductor element using an encapsulation resin composition, carrying out post mold curing processing for heating and curing the encapsulation resin composition, and carrying out reflow processing for attaching solder balls to a surface of the circuit board opposite to a surface thereof with the semiconductor element mounted thereon using a reflow device, characterized in that:
 the circuit board is heated using the reflow device at a higher temperature than a glass transition temperature of a cured product of the resin with which the fiber base material is impregnated, before mounting the semiconductor element on the circuit board so that, before the post mold curing processing, in between the post mold curing processing and the reflow processing, and after the reflow processing, the circuit board after the heating has a convex warp on a surface opposite to a surface on which the semiconductor element is disposed where both ends of the circuit board are regarded as reference positions.

4. A semiconductor device that is manufactured by impregnating a fiber base material with a resin to manufacture a circuit board with a thickness of not more than 500 μm, mounting a semiconductor element on one of surfaces of the circuit board, encapsulating at least an upper portion and side faces of the semiconductor element using an encapsulation resin composition, carrying out post mold curing processing for heating and curing the encapsulation resin composition, and carrying out reflow processing for attaching solder balls to a surface of the circuit board opposite to a surface thereof with the semiconductor element mounted thereon using a reflow device, characterized in that:
 the circuit board is heated using the reflow device at a higher temperature than a glass transition temperature of a cured product of the resin with which the fiber base material is impregnated, before mounting the semiconductor element on the circuit board, and,
 a thickness of the encapsulation resin composition heated and cured in the post mold curing processing is not more than four times a thickness of the circuit board so that, before the post mold curing processing, in between the post mold curing processing and the reflow processing, and after the reflow processing, the circuit board after the heating has a convex warp on a surface opposite to a surface on which the semiconductor element is disposed where both ends of the circuit board are regarded as reference positions.

5. The semiconductor device as claimed in claim 4 characterized in that the circuit board after the heating has a convex warp of less than 100 μm from the reference positions on the opposite surface side.

* * * * *